United States Patent
Mandal et al.

(10) Patent No.: US 6,770,424 B2
(45) Date of Patent: Aug. 3, 2004

(54) WAFER TRACK APPARATUS AND METHODS FOR DISPENSING FLUIDS WITH ROTATABLE DISPENSE ARMS

(75) Inventors: Robert P. Mandal, Saratoga, CA (US); Dikran Babikian, Millbrae, CA (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/320,994

(22) Filed: Dec. 16, 2002

(65) Prior Publication Data

US 2004/0115567 A1 Jun. 17, 2004

(51) Int. Cl.⁷ .............................. G03F 7/30; G03F 7/40; G03D 5/00; B08B 3/00; B08B 3/12
(52) U.S. Cl. ................... 430/311; 430/325; 118/321; 134/172; 134/180; 134/902; 396/604; 396/611
(58) Field of Search ................... 430/311, 325; 118/321; 396/604, 611; 134/172, 180, 902

(56) References Cited

U.S. PATENT DOCUMENTS

| | | | |
|---|---|---|---|
| 5,020,200 A | 6/1991 | Mimasaka et al. | 29/25.01 |
| 5,374,312 A | 12/1994 | Hasebe et al. | 118/52 |
| 5,625,433 A | 4/1997 | Inada et al. | 396/604 |
| 5,815,762 A | 9/1998 | Sakai et al. | 396/611 |
| 5,845,170 A | 12/1998 | Ogata | 396/604 |
| 5,954,877 A | 9/1999 | Hayes | 118/319 |
| 6,033,475 A | 3/2000 | Hasebe et al. | 118/320 |
| 6,113,695 A | 9/2000 | Fujimoto | 118/684 |
| 6,183,810 B1 | 2/2001 | Ota | 427/240 |
| 6,210,050 B1 | 4/2001 | Plat et al. | 396/604 |
| 6,283,107 B1 | 5/2001 | Inada | 396/604 |
| 6,267,516 B1 | 7/2001 | Nagamine | 396/604 |
| 6,284,043 B1 | 9/2001 | Takekuma | 118/52 |
| 6,364,547 B1 | 4/2002 | Matsuyama et al. | 396/611 |
| 6,382,849 B1 | 5/2002 | Sakamoto et al. | 396/611 |
| 6,384,894 B2 | 5/2002 | Matsuyama et al. | 355/27 |
| 6,394,111 B1 | 5/2002 | Jacobs et al. | 134/113 |
| 6,458,208 B1 | 10/2002 | Anai et al. | 118/52 |
| 6,616,762 B2 * | 9/2003 | Iwada | 118/319 |

FOREIGN PATENT DOCUMENTS

WO          WO 0016163          3/2000

* cited by examiner

Primary Examiner—Richard L. Schilling
(74) Attorney, Agent, or Firm—Blakely, Sokoloff, Taylor & Zafman LLP

(57) ABSTRACT

Methods and apparatus for controllably dispensing fluids within wafer track modules using rotatable liquid dispense arms and nozzles. The fluid dispense apparatus may be specifically selected for developing a photoresist-coated substrate. A series of one or more rotatable arms can be mounted adjacent to a mounted substrate within a develop module, wherein each arm supports a dispense nozzle that is connected to a fluid source. The dispense nozzle may be formed with a plurality of nozzle tips for dispensing selected developer and rinse fluids. Each rotatable arm can be configured to rotate about its longitudinal axis to selectively position the dispense nozzle between various dispense positions and non-dispense positions to reduce risk of dripping solution onto the substrate. Methods for developing photoresist-coated semiconductor wafers are also provided herein using developer and rinse fluid dispense apparatus with a dispense arm that is rotatable about its longitudinal axis. While in a dispense position, the arm or nozzle itself can be rotated so as to direct nozzle tips towards a wafer surface which facilitates fluid dispense onto the surface. While in the non-dispense position, the nozzle tips may be directed away from the wafer surface to reduce the likelihood of any undesired drips falling thereon.

30 Claims, 9 Drawing Sheets

WAFER TRACK APPARATUS AND METHODS FOR DISPENSING FLUIDS WITH ROTATABLE DISPENSE ARMS

FIELD OF THE INVENTION

The invention relates to apparatus and methods for dispensing fluids used in semiconductor processing. More particularly, the invention relates to dispensing developer and rinse solutions onto photosensitive coated substrates with reduced occurrences of defects.

BACKGROUND OF THE INVENTION

The photolithography process is an important technique used in forming selected circuit patterns on a semiconductor wafer. In general, a photoresist film can be deposited onto a substrate wafer during this process and thereafter pattern-exposed to lithographic equipment in order to transcribe a selected circuit pattern. The photoresist is subsequently developed with a developer solution to obtain a resist pattern corresponding to the transcribed pattern. The developer is intended to remove the relatively more soluble areas of photoresist, and leave behind the remaining patterned image which basically serves as a mask for etching multiple semiconductor wafer layers.

In order to form desired patterns on a substrate, the photoresist is processed during the development step with a solution that is applied in a highly controlled manner. Photoresist or resist development is carried out while a semiconductor wafer is rotated at various speeds and stopped intermittently at preselected time intervals for processing. For example, the wafer may be rotated while a developing solution is dispensed onto the wafer from the discharge port of a developer nozzle. A developing solution film may be thus formed which is intended to have a relatively uniform thickness across the surface of the wafer. Both the wafer and the developer film formed thereon are held stationary thereafter for a predetermined time interval so that developing solution remains in intimate contact with the resist-coated wafer in order to develop a light-exposed latent image thereon. Upon completion of this step in the development process, pure water or other rinse solution can be supplied from a washing liquid supplying nozzle onto the surface of the wafer. The pure water or rinse solution may be eventually scattered off by rotating the wafer at a relatively high speed to spin dry the surface of the wafer to complete this stage of wafer processing.

There are several common methods for developing a photoresist patterned image. For example, multiple wafers may be batched-immersed and agitated in a developer bath during a process known as immersion developing. This development process has certain advantages including high throughput capabilities. However the exposure time of the resist to the developer is relatively long, and the overall process typically does not produce the desired level of tight critical dimension control that is required in processing more densely populated semiconductor wafers. Alternatively, in spray development, the developer can be sprayed onto a resist while the wafer is spun at relatively high speed. Each wafer is individually treated with its own dose of developer solution. While spray development is generally an effective method to dissolve resist, it is often difficult to control the precise and even application of the developer to the wafer through the spray nozzle. During application of the developer, a portion of the solution may be sprayed outside of the wafer surface and wasted. Uneven exposure to developer may also adversely affect critical dimension control.

Another development process followed in the industry today is known as puddle development A predetermined amount of developer is initially dispensed onto the resist surface during this process while the wafer is rotating at a relatively slow speed. The developer can be supplied while the wafer is rotated on a spin chuck and held in place by vacuum suction. As the developer is applied to the wafer, the spinning motion causes the developer to spread out over the surface in a relatively outward direction. Application of the developer is often accomplished through a nozzle that is positioned at a desired location above the wafer which may include a region above its axis of rotation. As the wafer is rotated, the nozzle dispenses developer onto the resist-coated wafer. During application of the developer, it has been observed that the center portion of the wafer is the principal region continuously exposed to freshly dispensed developer. A relatively non-uniform layer of developer may therefore result which can adversely impact critical dimension (CD) control of the patterned resist. Moreover, developer solution is often dispensed rapidly through conventional nozzles such that developer essentially collides with the wafer surface. While it is often desired to coat the entire surface of the wafer with the developer as soon as possible, which calls for the use of a relatively high-pressure supply source, this type of high impact collision with the wafer often leads to adverse consequences such as uneven development of the photoresist pattern or non-uniform line width patterns.

A major problem associated with conventional developing apparatus is their failure to prevent inadvertent dripping of developer onto processed wafer substrates. Following the dispense of developer and rinse solutions with conventional liquid nozzles, residual amounts of fluid are often known to "drip" onto the underlying wafer. It is well known that fluid drips are a leading cause of wafer defects. Drips of developing solution or water may also include certain added impurities residing on the surface of a nozzle body which can contaminate the wafer. The occurrence of drips may result in developing defects, line width defects and shape failures along with other undesirable consequences. Moreover, if drops of pure water or other liquid solution inadvertently contact the wafer after substantial completion of the developing process, the undesired effects of what is known as "pH shock" can also give rise to wafer defects caused by liquids having a large difference in pH coming in contact with each other. The available equipment and methods used today do not fully meet the high performance demands required by current developer and fluid dispense applications.

There is a need for more improved developer apparatus and methods which reduce the occurrence of wafer defects and uneven development.

SUMMARY OF THE INVENTION

The invention herein provides methods and apparatus for controllably dispensing fluids during semiconductor wafer processing. The concepts of the invention may be applied to the develop module within a wafer track system where various developer and rinse solutions can be dispensed onto processed wafers in a highly controlled manner to avoid or minimize wafer defects. All aspects of the invention herein may be applied however to other types of liquid dispense systems or wafer processing modules to reduce the occurrence of unwanted drips onto wafer substrates and coatings. The invention provides flexible methodologies and apparatus that efficiently utilize materials in fluid development and processing: It shall be understood that particular features of the described embodiments of the invention herein may be considered individually or in combination with other variations and aspects of the invention.

It is therefore an object of the invention to provide apparatus for controllably dispensing fluids onto semiconductor wafers. A develop module within a wafer track system may include one or more rotatable liquid dispense arms and dispense nozzles. The fluid dispense apparatus may be specifically selected for developing a photoresist-coated substrate. For example, the develop module may include conventional spin chucks for supporting and rotating the photoresist-coated substrate while exposed to a variety of developer fluids that are dispensed onto the substrate surface. A series of one or more rotatable arms can be mounted adjacent to the spin chuck wherein each supports a dispense nozzle that is connected to developer source(s). The dispense nozzle may be formed with a plurality of nozzle tips for dispensing developer solution onto the photoresist-coated substrate surface. The rotatable arm can be configured to rotate about its longitudinal axis to selectively position the dispense nozzle between various dispense positions which direct the nozzle tips in a direction substantially towards the substrate surface. At the same time, the arm or nozzle itself can be rotated to various non-dispense positions, which direct the nozzle tips substantially away from the substrate surface to reduce risk of dripping developer solution onto the substrate. The rotatable arms herein may include a series of one or more motor-driven actuators for rotating the arm about its longitudinal axis and for sweeping the rotatable arm across selected regions above the substrate. Alternatively the rotatable arm maybe configured as a radial arm which is mounted on a support post to allow pivotal movement about a selected axis to move the nozzle along a predefined arc pathway, or as a linear track arm which moves along a track assembly while supporting the nozzle.

The developer modules and other fluid dispense sections within a wafer track system may further include one or more rotatable rinse arms in accordance with another embodiment of the invention. For selected applications, these arms may be mounted adjacently to the spin chuck for supporting a rinse nozzle that is in fluid communication with rinse source(s). As with the developer nozzles described herein, the rinse nozzle may be similarly formed with a plurality of rinse nozzle tips for dispensing rinse fluid onto a substrate surface. The rinse arm may be also configured to rotate about a longitudinal axis defined along its length in order to selectively position it within preselected ranges of a rinse position and a non-rinse position.

Another aspect of the invention provides methods for developing photoresist-coated semiconductor wafers. The developer and fluid dispense apparatus herein may include a developer arm that is rotatable about its longitudinal axis to selectively rotate the dispense nozzle between a dispense position and a non-dispense position. While in the dispense position, the arm or nozzle itself can be rotated so as to direct the nozzle tips towards the wafer surface which facilitates fluid dispense onto the surface. While in the non-dispense position, the arm or nozzle can be rotated to direct the nozzle tips away from the wafer surface to reduce the likelihood of any undesired drips falling thereon. The nozzle tips through which fluid is dispensed may be thus pointed within a full range of directions including: a relatively neutral or upwardly pointing direction relative to the wafer surface to minimize drips; and a relatively downwardly pointing direction relative to the wafer surface while dispensing developer or other fluids.

Other goals and advantages of the invention will be further appreciated and understood when considered in conjunction with the following description and the accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. Many changes and modifications may be made within the scope of the invention without departing from the spirit thereof.

BRIEF DESCRIPTION OF THE DRAWINGS

The illustrations included within this specification describe advantages and features of the invention. It shall be understood that similar or like reference numerals and characters within the figures designate the same or like features of the invention. It should be further noted that the illustrations provided herein are not necessarily drawn to scale.

DETAILED DESCRIPTION OF THE INVENTION

Figure 1:
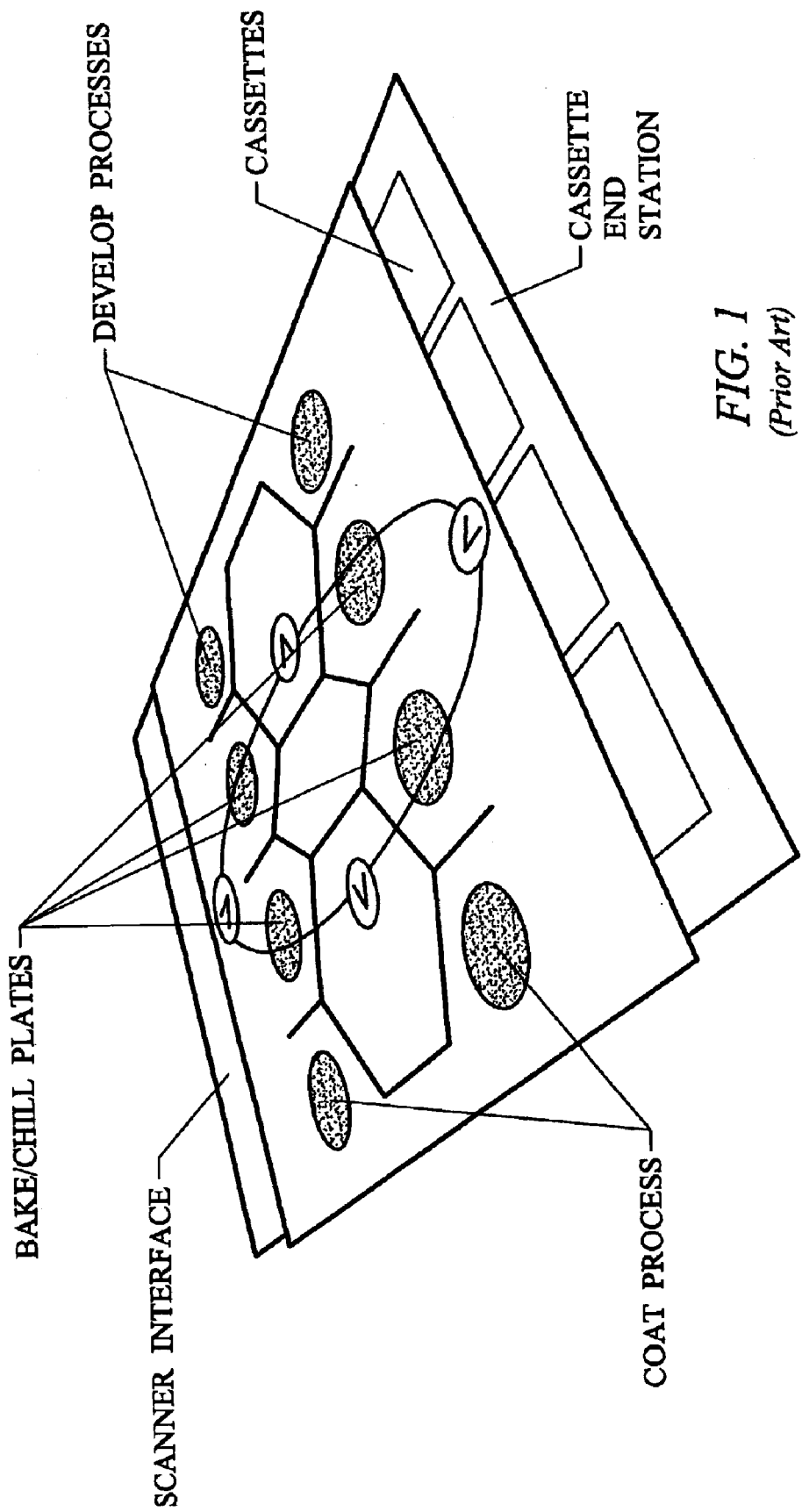
FIG. 1 is a simplified floorplan layout of a wafer track system that includes various processing modules used for semiconductor wafer manufacturing.

The invention may be applied to conventional semiconductor processing equipment such as the wafer track system generally described in FIG. 1. The wafer track system may include basically three sections: a cassette end interface section, a scanner interface section, and a process section. The cassette end interface section includes apparatus to transfer wafers from cassettes in which they are stored to the track system and, conversely, from the track system back to cassettes following processing. The scanner interface section may be considered another transition area that accommodates equipment for transferring wafers between the track system and photolithographic apparatus. Meanwhile, the process section of a wafer track basically includes a number of wafer processing modules such as resist coating spin modules, bake/chill modules and resist developing spin modules. As shown in the system layout of FIG. 1, the various process stacks within a wafer track may be arranged in an organized manner or optimal configuration to realize certain benefits and wafer handling efficiencies. For example, a number of process stations may be configured within the process section having stacks of processing modules for resist coat and develop processes. Stacks of thermal modules may also be included for heating and cooling wafers having heat exchange apparatus such as bake/chill plates. The process stations as shown in FIG. 1 may include a pair of photoresist coat sections or stacks of processing modules for applying the initial resist coating onto wafers, and a pair of developing sections with modules for developing a patterned resist/coated wafer. The wafers may be delivered and transported within the track system between process stations using a series of robotic arms or other wafer handling apparatus according to a desired program or set of instructions in accordance with a predetermined order of processing.

A semiconductor wafer treatment process involves a highly organized set of procedures. Wafers may be initially fed into the wafer track from one or more cassettes stored locally at a cassette end station. As shown in the floorplan of FIG. 1, a series of wafer cassettes can be arranged in a set of four distinct columns supported on a cassette-mounted table. A wafer carrying robot may gain access to a desired cassette in order to transfer wafers from and to selected process modules within the wafer track system in response to commands received from a controller (not shown). Before forming a photoresist film layer onto a wafer substrate, the wafer may be first transferred to a priming module where its surface can be thermally or chemically treated to remove the presence of moisture and to assure a hydrophobic surface. The wafer may then be cooled with thermal devices such as a chill plate, and then conveyed to a coating unit where a photoresist polymer is distributed evenly onto the wafer surface. The photoresist-coated wafer may be subsequently transferred to a heating unit or bake plate in order to heat and convert the photoresist polymer into a stable film. Upon completion of the heating step, the processed wafer may be cooled and either conveyed to a cassette for storage, or as in many instances, transferred directly to adjoining stepper apparatus through a stepper or scanner interface. The photoresist coating or film on the wafer is then exposed to a circuit pattern by a applicable photolithographic techniques within the stepper apparatus. After exposure of the stable film, the wafer can be transferred back to the track system and heated in a bake module to set the circuit pattern onto the film. The wafer may be then cooled in a chill module, and transferred to a develop module. In the develop module, a solution is applied onto the film to develop a portion of the film, and then a rinse solution is applied thereafter onto the wafer in order to remove developer solution from the surface of the wafer. The wafer may be thermally treated in a bake module afterwards, cooled in a chill module, and then returned to a cassette for storage. The fluid dispensing apparatus and methods provided herein in accordance with the invention may be applied to many developing systems available today including those described herein.

Figure 2:
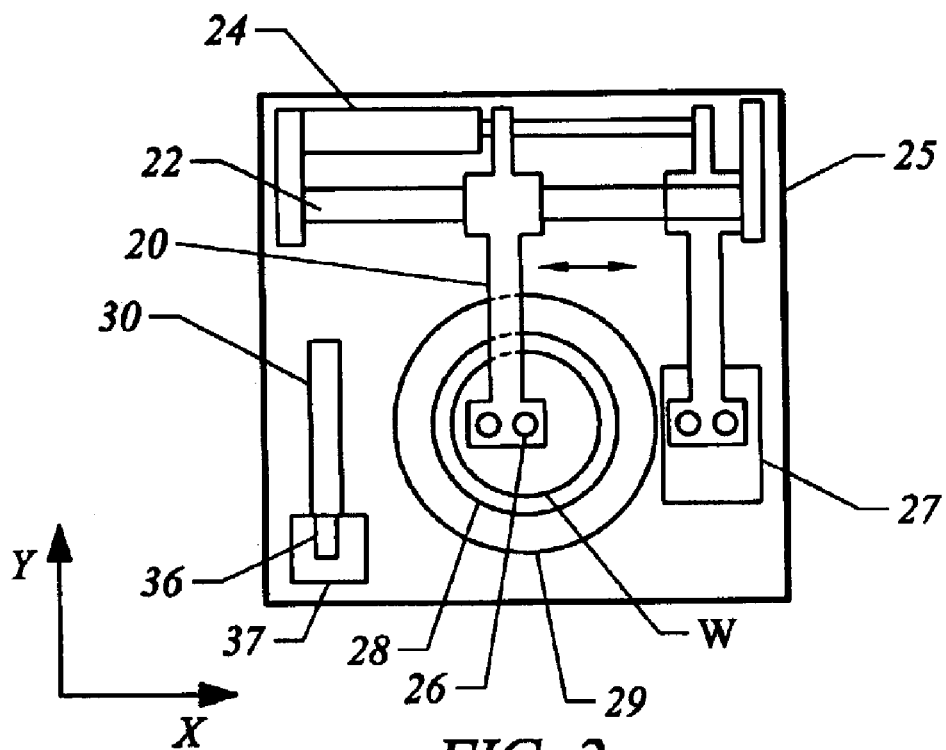
FIG. 2 is a top view illustration of a conventional linear track and radial arm fluid dispense system within a develop process module.
Figure 3:
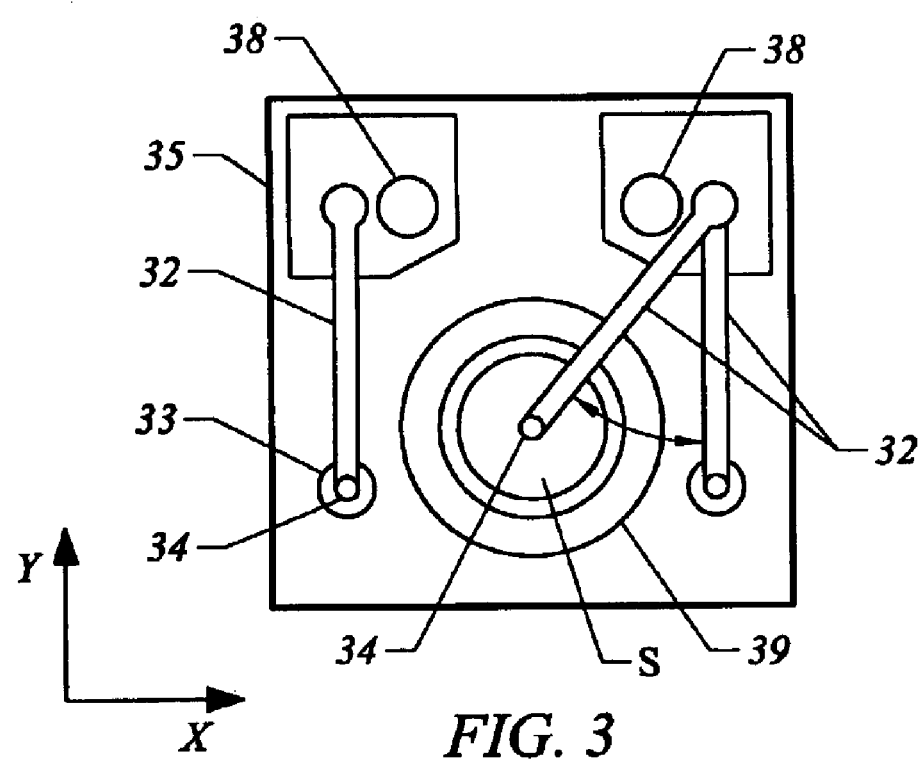
FIG. 3 illustrates a dual-dispense radial arm assembly within a develop module.

As shown in FIGS. 2–3, developer modules within a wafer track system may include a variety of fluid dispense arms. The configuration shown in FIG. 2 illustrates a linear track developer arm 20 that is movable along a defined X-axis direction. The linear arm 20 may be directed to slide along a set of rails 22 and driven by conventional electrically-actuated motors 24 or other drive mechanisms in order to move the arm back and forth along various positions within the module 25. The arm 20 may be also constructed to move in a relatively vertical direction in order to control the distance between the wafer W and the developing solution and/or rinse supply nozzle 26. The linear arm 20 may include two separate nozzles 26 for dispensing fluids such as developer and/or rinse solutions. A nozzle bath 27 may be also provided for soaking or washing the nozzle 26 when resting in a home position as shown. Furthermore, the linear arm 20 may be moved into a dispense position over a selected region above a wafer W mounted relatively flat onto a spin chuck 28 that is positioned within a cup or containment vessel 29. A variety of one or more fluids may be thus dispensed through the nozzle(s) 26 onto the wafer. Additionally, a radial fluid dispense arm 30 may be installed within the develop module 25 for dispensing a rinse solution or yet another type of develop process solution. Another bath 37 may be also selected for the rinse nozzle 36 mounted on the radial arm 30 when placed in a home or stand-by position. The radial arm 30 may be pivotally mounted within the develop module 25 in proximity to the spin cup 29 so as to selectively sweep across and above the underlying wafer W horizontally along a defined X-Y plane at preselected intervals during develop processes such as those described herein. Alternatively, as shown in FIG. 3, a develop module 35 may include a plurality of radial fluid dispense arms 32 each having a nozzle 34 mounted thereon for directing fluids to be dispensed onto an underlying substrate (S) such as a photoresist-coated wafer. Each radial arm 32 may be mounted on relatively opposite sides of the spin cup 39, and may have a dedicated nozzle bath 33 when positioned in a home or rest position. At selected time intervals during wafer processing, either or both arms 32 may swing out over the substrate S to dispense selected fluids thereon. The fluid dispense arms 32 may be driven and controlled by available driving means 38 as with other fluid dispense arm assemblies described herein.

A variety of develop processes may be carried out in accordance with the invention with conventional apparatus as shown in FIGS. 2 and 3. For example, during the development of a resist-coated wafer substrate, the wafer may be first mounted on a spin chuck or platform. A developing solution supply nozzle, which may be ordinarily kept in a stand-by or home position relatively outside the immediate area of the wafer W, can sweep or scan above the wafer while supplying the developing solution. The nozzle may direct developing solution over a certain wafer location for a preselected period of time or after a desired amount of fluid is released. The developing solution supply nozzle may be thereafter returned back to a stand-by or home position. After a predetermined amount of developing time has passed, and the developing process is allowed to proceed to substantial completion, an amount of rinse solution or pure deionized water can be supplied onto the wafer W to rinse the wafer. However with the type of developing process equipment used today, the supply nozzle can pass above the wafer again thus posing a substantial risk of developing solution drips falling onto the already processed wafer. The risk of forming drips is increased further since a relatively significant amount of developer solution under pressure is often deposited onto a wafer W quickly within a relatively short amount of time and with relatively high-impact in close proximity to the dispense nozzle. When developing solution drips onto the wafer, the drip may contain a different concentration than that of a developer layer already deposited onto the wafer possibly leading pH shock, and may farther contain contaminants removed from the external surface of the supply nozzle. Drips may thus cause wafer defects, line width defect, shape failure of the wafer and other undesired wafer characteristics. The invention described herein may be applied to such wafer track systems and develop modules to avoid or minimize the aforementioned limitations during wafer processing and pattern development.

Figure 4:
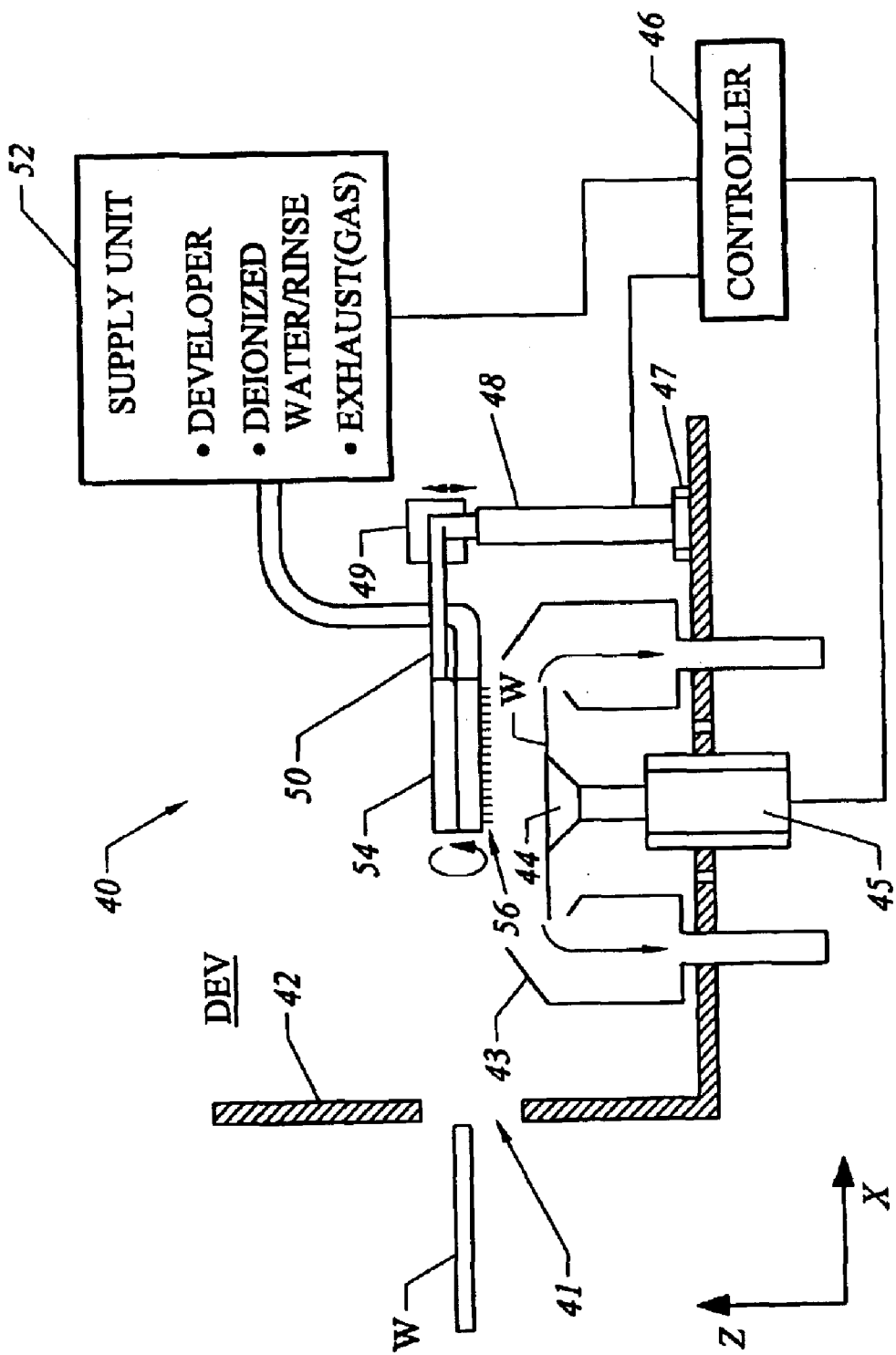
FIG. 4 is a cross-sectional side view of a develop process module that incorporates a fluid dispense arm and nozzle provided in accordance with one aspect of the invention.

FIG. 4 illustrates an embodiment of the invention incorporated into a wafer track process module 40 (DEV). A cross-sectional side view of the develop process module 40 is provided taken along a defined X-Z plane. The develop unit 40 may include a wafer delivery port 41 formed on a side wall portion 42 thereof. The wafer delivery port 41 can be opened or closed by a shutter so that a wafer W can be transported by a wafer holder or transporter into and out of the unit 40. In addition, a spin cup 43 may be positioned in a substantially central region of the developing unit 40 as shown. A spin chuck 44 may be also positioned within the cup 43, and may include a motor or a rotary driving mechanism 45 that can be variably positioned along a vertical Z-axis direction as instructed by a controller 46. The spin chuck motor 45 may be also -connected to and controlled by the controller unit 46 to rotate the spin chuck 44 as desired. The wafer W may be held in place on the spin chuck 44 with conventional vacuum suction equipment or other known alternatives.

As illustrated in FIG. 4, the fluid dispense arm and nozzle assembly formed in accordance with the invention can be positioned within the develop unit 40 relative to the wafer W. The fluid dispense arm 50 may be mounted on a base 47 to provide a linear track arm as described herein to slidably move along a guide rail mounted along the bottom portion of the unit 40 and extend in a Y-axis direction (not shown). Alternatively, the base 47 of the dispense arm 50 may be positioned at a relatively fixed location within the develop unit 40 so that the dispense arm may pivotally move about a respective Z-axis to provide a radial dispense arm that sweeps over the cup 43 and wafer W therein along a predefined arcuate path. The predefined path for the radial arm 50 can pass over a substantially central portion above of the underlying substrate W. With either a linear or a radial arm configuration, the dispense arm 50 may be positioned atop a vertical telescoping post 48 or extendible member that can move in a relatively up-and-down direction along a Z-axis by a selected driving mechanism connected to and controlled by the controller. Furthermore, a separate rinse nozzle (not shown here) may be mounted to yet another separate fluid dispense arm installed within the develop unit that is controlled by the controller for directing its respective X-axis, Y-axis and Z-axis driving mechanisms that can be electrically-actuated. These driving mechanisms may include a motor-driven actuator 49 for rotating the rinse arm about its longitudinal axis and/or for sweeping the rotatable arm across selected regions above the substrate W. For example, a rotatable rinse arm can be mounted adjacent to the spin chuck for supporting a rinse nozzle that is connected to a fluid rinse source. The rinse nozzle may be formed with a plurality of rinse nozzle tips for dispensing rinse fluid onto the substrate surface. The rinse arm can be rotated between: a rinse position that directs the rinse nozzle tips in a direction substantially towards the substrate surface; and a non-rinse position that directs the rinse nozzle tips substantially away from the substrate surface to reduce risk of rinse fluid dripping onto the substrate. In accordance with this aspect of the invention, both the developer and rinse dispense arms within the develop module may be configured to rotate about their respective longitudinal axis (as indicated by the arrow) to direct the tips 56 formed along a bottom surface of the nozzle away from the underlying substrate. Instead of maintaining the nozzle tips 56 in a relatively downward pointing direction toward the substrate, which presents the risk of dripping, the dispense arm 50 or nozzle 54 itself can be rotated such that the nozzle tips are directed in a relatively more upward direction.

The fluid dispense nozzles illustrated herein may be connected to a supply unit 52 to provide developer solution or other fluid sources such as deionized water onto the wafer W. The fluid dispense nozzles 54 may independently dispense one or more fluids at variable flow rates ranging from about 0 to 100 cc/second. Furthermore, a series of one or more compartments or chambers may be formed in the fluid dispense nozzle to distribute more than one type of fluid from the same nozzle and without re-positioning the nozzle. A variety of multi-dispense or multi-port nozzles may be incorporated with the invention herein such as those described in the commonly owned and copending U.S. patent application Ser. No. 10/265,203, entitled "Method and Apparatus for Mitigating Cross-Contamination Between Liquid Dispensing Jets in Close Proximity to A Surface" filed on Oct. 3, 2002, which is incorporated by reference herein in its entirety. Such dispense nozzles may be connected to pressured fluid sources containing inert gases to provide gas blankets which mitigate cross-contamination of dispensed fluids. A similar series of manifolds or orifices may be likewise formed in nozzles provided herein but connected instead to a vacuum source in order to suck back developer or other unwanted dispensed fluids from the nozzle body to avoid unwanted dripping onto the processed surface. Other aspects of the invention described herein however may substantially eliminate unwanted dripping without the need for suck-back apparatus which can often present their own set of challenges particularly for multiple interconnected nozzles.

A preferable embodiment of the invention provides rotatable fluid dispense arms that may be particularly adapted for wafer track develop modules in developing a photoresist-coated substrate. A spin chuck within the module may be selected for supporting and rotating the photoresist-coated substrate. Moreover, one or more developer sources may be connected to a dispense nozzle to supply developer solution onto a substrate surface. The dispense nozzle may be mounted on a relatively distal portion of a rotatable arm that is positioned relatively adjacent to the spin chuck and cup. The dispense nozzle can be in fluid communication with the developer source through a network of tubing leading to a series of fluid channels formed in the nozzle. Furthermore, the dispense nozzle can be formed with a plurality of nozzle tips for dispensing developer solution onto the photoresist-coated substrate surface. The rotatable arm may be instructed upon command by a controller to rotate about a longitudinal axis defined along its length to selectively position or turn the dispense nozzle between various positions in accordance with an aspect of the invention herein. The dispense nozzle and/or arm can rotate or alternate between various dispense positions which direct the nozzle tips in a direction substantially towards the substrate surface, and non-dispense positions which direct the nozzle tips substantially away from the substrate surface to reduce risk of dripping developer solution onto the substrate. In particular, the nozzle tips may be directed away from the substrate surface at an angle ranging from approximately 0 to 90 degrees relative to the substrate surface, or even relatively parallel to the surface while positioned in a non-dispense position. The nozzle tips formed along the bottom surface of the dispense nozzle may be uniformly or non-uniformly spaced apart in a relatively linear pattern to provide a row of nozzle tips having a predetermined length equal to approximately one-half of the diameter of the substrate. The row of nozzle tips can thus direct developer and other fluids over the complete surface of a spinning wafer.

Figure 5:
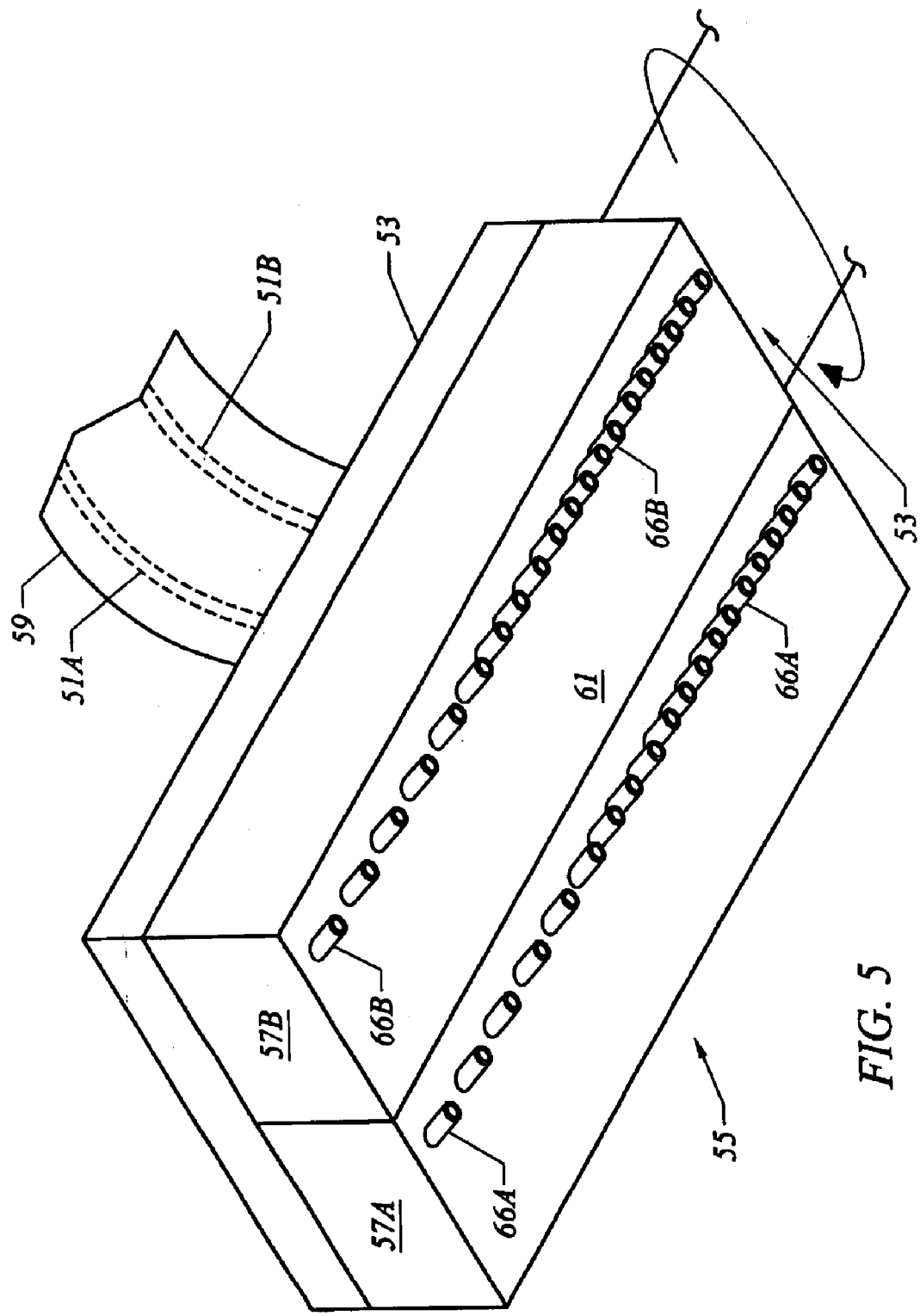
FIG. 5 is a bottom view perspective illustration of a dispense nozzle mounted on a rotatable arm with connecting fluid input lines.

FIG. 5 illustrates a fluid nozzle 55 provided in accordance with the invention. The dispense nozzle 55 itself may be rotatably mounted to the distal tip portion 53 of a relatively fixed dispense arm, or as previously discussed herein, a motor-driven mechanism may be selected to rotate the entire dispense arm. The series of one or more rows of nozzle tips 66A and 66B may be thus directed in a manner to minimize the likelihood of fluid dripping onto an underlying substrate. The nozzle tips 66A and 66B may receive fluids to be dispensed through a series of one or more fluid inlet lines 51A and 51B feeding into a relatively top portion 53 of the nozzle 55. The inlet lines 51A and 51B may be contained within a thermal insulating jacket 59 or other known heat transfer apparatus to deliver one or more fluids to the nozzle 55 within preselected temperatures. Each inlet line 51A and 51B may be connected or in fluid communication with a pair of separate chambers 57A and 57B or manifolds leading to their respective plurality of nozzle tips 66A and 66B. While two fluid dispense chambers 57A and 57B are illustrated herein, it shall be understood that more or less may be selected having their respective inlet and plurality of nozzle tips for each chamber. For example, a nozzle may be configured with three separate fluid dispense chambers or compartments in accordance with this aspect of the invention. While the overall size of the nozzles herein may vary according to the desired size of each chamber and the total number thereof, a preferable nozzle may be formed with a height of approximately three-quarters of an inch and approximately two-inches in width (or alternatively about one-inch in width per each fluid dispense chamber selected). The nozzle tips 66A and 66B herein may be formed at angles relative to a bottom surface 61 of the nozzle body 55. The nozzle tips 66A and 66B may also be spaced along a series of rows having a selected length that is equal to about one-half the diameter of a substrate wafer such as the 200 mm and 300 mm semiconductor wafers commonly used today for fabricating integrated circuits. Each row of nozzle tips 66A and 66B may be in fluid communication with a corresponding fluid chamber 57A and 57B formed in the nozzle 55. It should be noted that the angled nozzle tips 66A and 66B need not be spaced apart evenly within each row so that certain underlying regions along the relatively inner and outer portions of wafer may receive more or less dispensed fluids.

Figure 6:
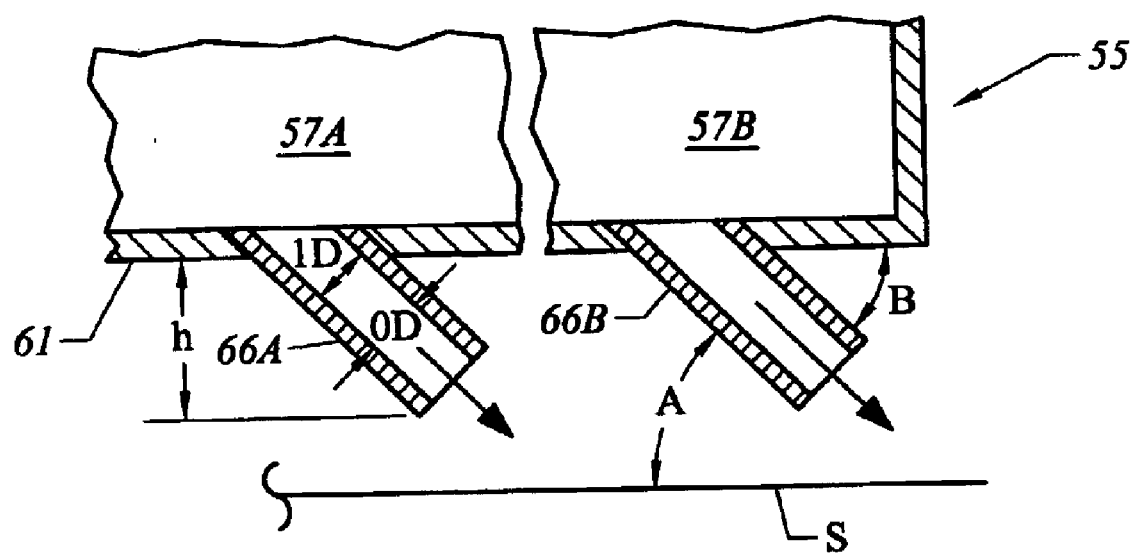
FIG. 6 is a sectional close-up view of fluid dispense nozzle tips formed at predetermined angles to dispense fluids onto substrates with reduced impact.

FIG. 6 is a sectional close-up view of the above illustrated fluid dispense nozzle tips 66A and 66B. The nozzle tips 66A and 66B as shown may be formed at a predetermined angle (A) relative to a planar substrate surface. Fluids may be thus dispensed onto a substrate surface S at an angle to reduce the effect of fluid impact on rotating wafers. Developer and other solutions may be deposited through the tips 66A and 66B formed at a preselected angle B ranging between 0 and 90 degrees, and preferably at 45 degrees, relative to the bottom surface 61 of the nozzle body 55. These nozzle tips 66A and 66B may be configured with an outer diameter (OD) of various sizes, and an inner diameter (ID) ranging from about 0.5 mm to 4.0 mm. The ID of nozzle tips 66A and 66B may be approximately 1 mm or sufficiently small enough so that fluid capillary action may assist in retention or pullback of fluid within the tip. Although the nozzle tips 66A and 66B are generally illustrated herein with a cylindrical configuration, it shall be understood that other geometric shapes may be selected to direct fluid out of the nozzle 55 from its interior chamber 57A and 57B or region The nozzle tips 66A and 66B may be formed with a relatively smooth interior portions to provide steady fluid dispense, and may also include narrowed or tapered lip portions which can inhibit dripping. Moreover, the nozzle tips 66A and 66B and body portion may be integrally formed as a single piece or otherwise combined from separately formed nozzle insert and body components. The nozzles 55 herein may be manufactured from a variety of known hydrophobic materials such as Teflon FEP. Furthermore, as shown in FIG. 6, the nozzle tips 66A and 66B or inserts may extend a predetermined height (h) away from the nozzle body bottom 61. An advantage of forming a nozzle 55 with extended tips 66A and 66B is to reduce the accumulation of residual fluids along the external bottom surface 61 of the nozzle body 55 notwithstanding any attempts to remove such fluids by reversing the working fluid pressure within the nozzle and risking the return of air bubbles into the nozzle with conventional suck-back apparatus, which can be used with the invention herein but is not required. These nozzle tips 66A and 66B may be thus lowered or drawn relatively close to a substrate surface S to deposit fluids with a lessened or weakened impact thereon. Preferably, fluid dispense arms such as those described herein may lower and position the nozzle tips 66A and 66B to a programmed dispense position approximately 5 to 25 mm above the substrate. Fluids such as developer or deionized water are thus dispensed tangentially at an angle for lessened impact and relatively closer to the substrate surface S in comparison to the entire bottom surface 61 of the nozzle 55. Accordingly, the dispense arm supporting the nozzle 55 can be positioned relatively higher above the substrate to provide a greater distance or buffer between the relatively large external surface area of the nozzle body and the deposited fluid. When developer is deposited onto a spinning wafer, it is therefore less likely to splashback onto the external body of the nozzle in comparison to the nozzle tips which have a relatively smaller external surface area but are in closer proximity to the surface fluid. By lessening exposure of deposited fluids with the principal surface area of the nozzle body, a significant source of unwanted drips may be thereby removed or reduced.

Figure 7A:
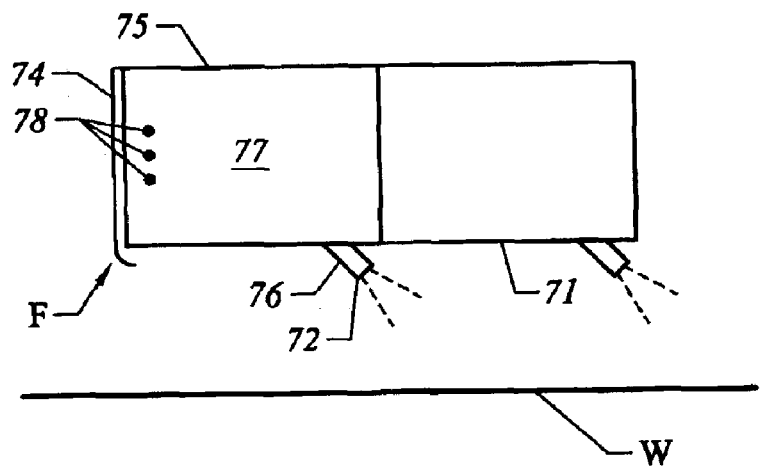
FIGS. 7A–7C are simplified side views of a multi-dispense nozzle with angled nozzle tips that is shown in various rotated positions.
Figure 7B:
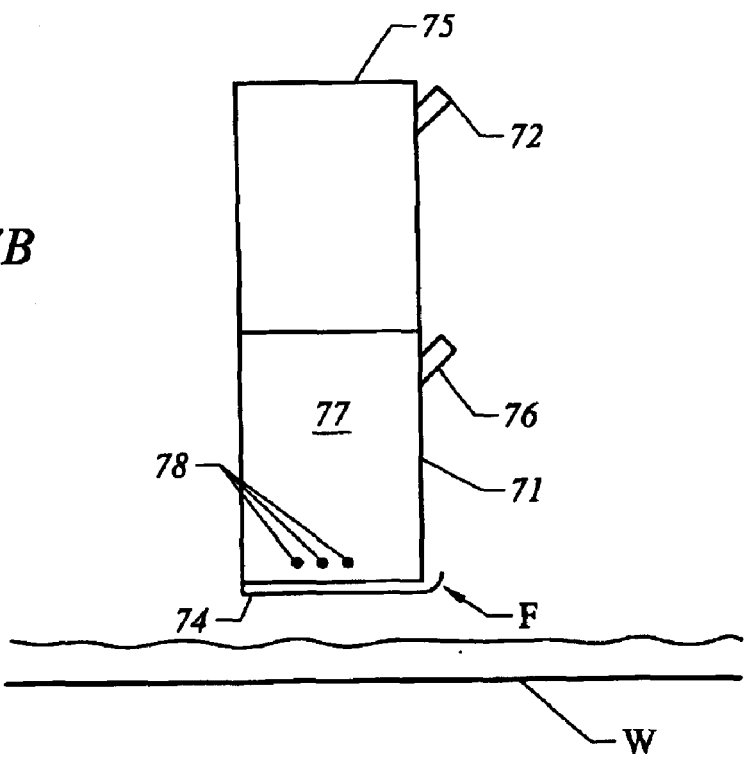
Figure 7C:
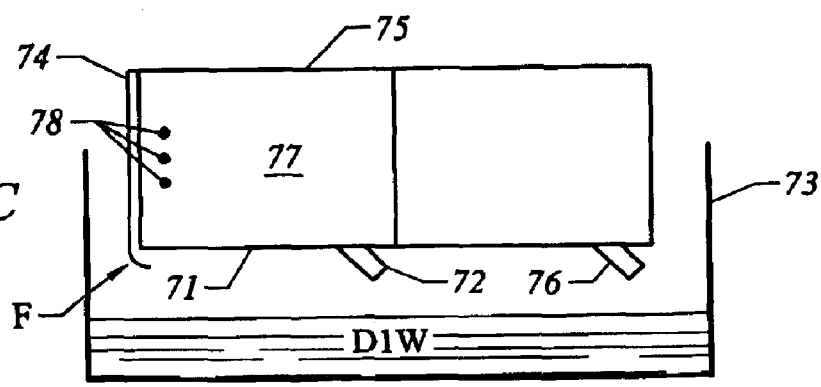

As shown in FIGS. 7A–7C, the invention further provides multi-dispense nozzles that can be rotatably mounted or fixed onto rotating fluid dispense arms described herein to offer adjustable nozzle positions. These nozzles 75 may be particularly adapted to dispense fluids such as developer and rinse solutions onto a semiconductor wafer W with reduced dripping. For example, the dispense nozzle may be formed with fluid openings or outlets 72 through which one or more fluids can be dispensed from separated interior chambers or discrete compartments 77. The dispense arm supporting the nozzle or the nozzle itself can rotate about its longitudinal axis to selectively rotate the dispense nozzle between (i) a dispense position and (ii) a non-dispense position relative to the wafer. To prepare for fluid dispense, an arm positioning sequence may be programmed into and selectively executed by a controller to raise the dispense arm from a home position, optionally rotating the arm to a non-dispense position, and then moving the arm and dispense nozzle above and across a mounted wafer to the selected location or coordinates designated by the controller. As shown in FIG. 7A, the dispense arm may be rotated about its longitudinal axis to position the nozzle 75 into a dispense or programmed horizontal dispense position as instructed by the controller. The arm may be lowered prior to or thereafter in order to position the dispense nozzle 75 above the wafer W at the desired height which may be preferably 5 mm above the wafer before dispensing a predetermined amount of the fluid through nozzle openings 72 over selected portions of the wafer. The rotation of the arm may occur either concurrently or sequentially with the lowering of the arm and nozzle 75 to a programed dispense position or desired height. The relatively planar bottom portion 71 of the nozzle body may be thus aligned substantially parallel to the wafer W surface. While in its programmed horizontal dispense position, the nozzle 75 and dispense arm can be also swept within a desired range across the wafer W during fluid dispense. Upon completion of the fluid dispensing step(s), the arm positioning sequence may call for the dispense arm to rotate again as instructed by a controller about its longitudinal axis approximately 90 degrees or greater to position the dispense nozzle 76 into a non-dispense position before or while moving back to its home position thereby reducing the risk of dripping fluid onto the wafer W. The dispense arm may be elevated above the wafer W surface as needed so as not to collide with the wafer surface when rotating the nozzle 75, or to clear the elevated edge of a catch-cup when moving back to and from its home position. The planar bottom portion 71 of the nozzle body may be relatively perpendicular to the wafer W surface when placed in a non-dispense position as shown in FIG. 7B. When the tips 76 of the nozzle are formed at a predetermined angle, they may be pointing in a relatively upward direction substantially away from the wafer W surface thus minimizing further the likelihood of residual drips adhering to the nozzle tips which may otherwise fall onto a processed surface. In this position, gravity may actually act to draw back residual fluids into their respective fluid dispense chambers 77 within the nozzle body thereby inhibiting dripping as opposed to ordinarily acting to aid dripping when the nozzle 75 is left in a dispense position. For certain applications, it may be preferable to retain the fluid dispense arm in the same relative position above the wafer W surface perhaps during a desired time interval thus allowing development to occur, or it may be swept across or otherwise moved away from the wafer W. It shall be understood that the dispense arm-may be also swept across the wafer W in either a dispense or non-dispense position between selected locations and an originating home or stand-by position as shown in FIG. 7C. The nozzle 75 may soak in a bath solution 73 or otherwise maintained in a storage container with selected fluids such as deionized water for cleaning or keeping the nozzle within an environment having adequate moisture. This may reduce or minimize crystallization of fluids such as developer within the tips 76 or along external portions of the nozzle 75.

Furthermore, as shown in FIGS. 7A–7C, the nozzle 75 may be formed with a drip shield 74 attached to a side portion of the nozzle body. The drip shield 74 may include an extended flange F protruding away from the nozzle bottom surface 71. When the nozzle 75 is rotated back to its non-dispense position, residual drips from the nozzle tip 76 or body may be thus captured by the drip shield 74 rather than falling onto the processed wafer W thereby creating wafer defects. Moreover, a series of manifolds or orifices 78 may be formed in the nozzle body as described herein which are connected to a vacuum source in order to suck-back developer or other unwanted dispensed fluids trapped by the drip shield 74. It shall be understood that this embodiment is an optional variation of the invention that may provide even greater protection against unwanted drips or contamination originating from dispense nozzles.

Figure 8A:
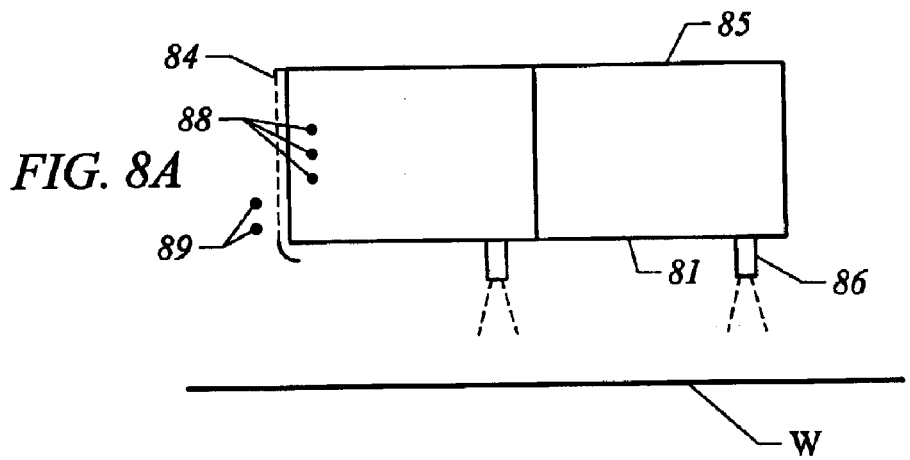
FIGS. 8A–8C are also simplified side views of yet another multi-dispense nozzle shown in different rotated positions which can be formed with relatively non-angled or perpendicular nozzle tips in relation to a substrate surface.
Figure 8B:
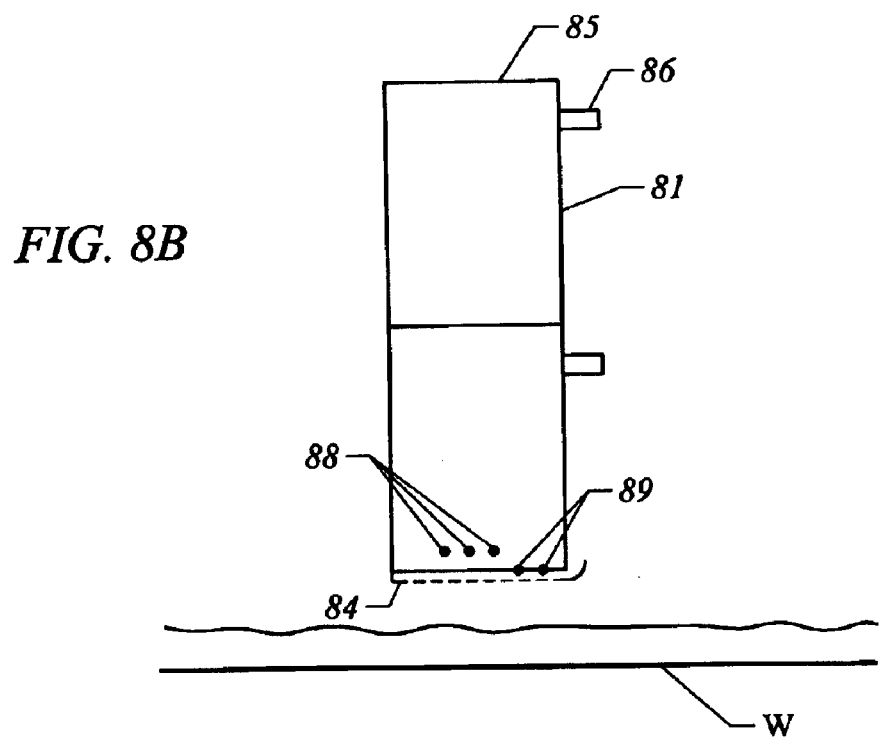
Figure 8C:
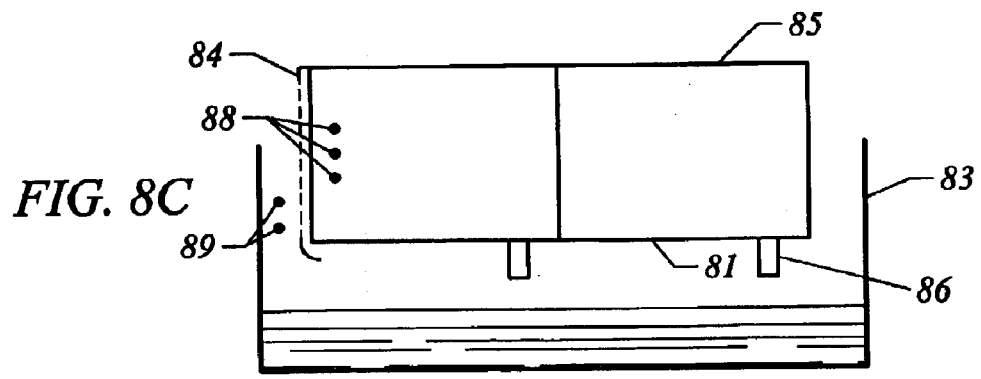

FIGS. 8A–8C illustrate yet another embodiment of the invention that provides multi-dispense nozzles 85 which are formed with relatively non-angled or perpendicular nozzle tips 86 in relation to a planar bottom nozzle surface 81. Similar to the rotation sequence of the multi-dispense nozzle provided above, a dispense arm supporting the nozzle 85 may be rotatable about its longitudinal axis between a dispense position and a non-dispense position relative to a wafer W surface. As shown in FIG. 8A, the dispense arm may be rotated about its longitudinal axis to position the nozzle 85 into a dispense position over a selected portion of the wafer W. The arm again may be lowered to a desired height above the wafer W, and may be also swept horizontally across the wafer while dispensing fluids. The dispense arm may be rotated when not dispensing fluids to pre-dispense or post-dispense positions thereby reducing the risk of dripping fluid onto the wafer W. The planar bottom portion 81 of the nozzle body may be positioned at various angles and may be relatively perpendicular to the wafer W surface as shown in FIG. 8B. When the nozzle tips 86 are formed at relatively right angles relative to the planar bottom surface 81 of the nozzle 95, these may be pointed in a relatively parallel direction relative to the underlying processed wafer W. It shall be understood however that either the dispense arm or nozzle 85 itself may be rotated further away from the wafer W beyond horizontal at an upward angle in order to further minimize the likelihood of residual drips from adhering to the nozzle tips 86 which could then later fall onto a processed surface causing unwanted wafer defects. As shown in FIG. 8C, the dispense arm may also return the nozzle 85 to a stand-by position and kept in a relatively moist environment 83 containing fluids such as deionized water to prevent the nozzle from drying out or allowing crystallization of fluids thereon.

The nozzles herein may further include a suck-through screen 84 as illustrated in FIGS. 8A–8C. As with previously described drip shields, a screen 84 may be mounted to the nozzle 85 in order to capture residual drips or droplets flowing from the nozzle body or tips 86. The suck-through screen 84 however also permits the flow of residual fluids therethrough which can adhere to an external surface of the screen itself. For example, when the nozzle 85 is rotated to a non-dispense position, a relatively fine screen 84 may be positioned directly over deposited fluids on a wafer W surface to capture fluids which may drip from a nozzle surface or nozzle tips 86. In such proximity to the deposited fluids, it has been further observed that mist or condensed vapor may form on the external surface of the nozzle body, and particularly on the screen portion 84 itself facing the fluid. Mist is known to cause pattern defects and can be generated during the developer step and/or the rinse step. Accordingly, a series of exhaust orifices 88 and vacuum channels formed in the nozzle body as previously described can suck-away any drips caught by the screen 84 in addition to vapor or condensed liquid in the neighboring area of the nozzle 85 through the perforations or openings 89 formed in the screen. When the nozzle 85 is rotated to a dispense position, surrounding mist can be similarly evacuated from the area surrounding the screen 84 and the nozzle body. Such material including vapor or mist flung up from a spinning wafer W can be thus removed and directed away from the nozzle 85 which could otherwise accumulate or drip back onto a treated surface thereby causing unwanted defects.

Figure 9A:
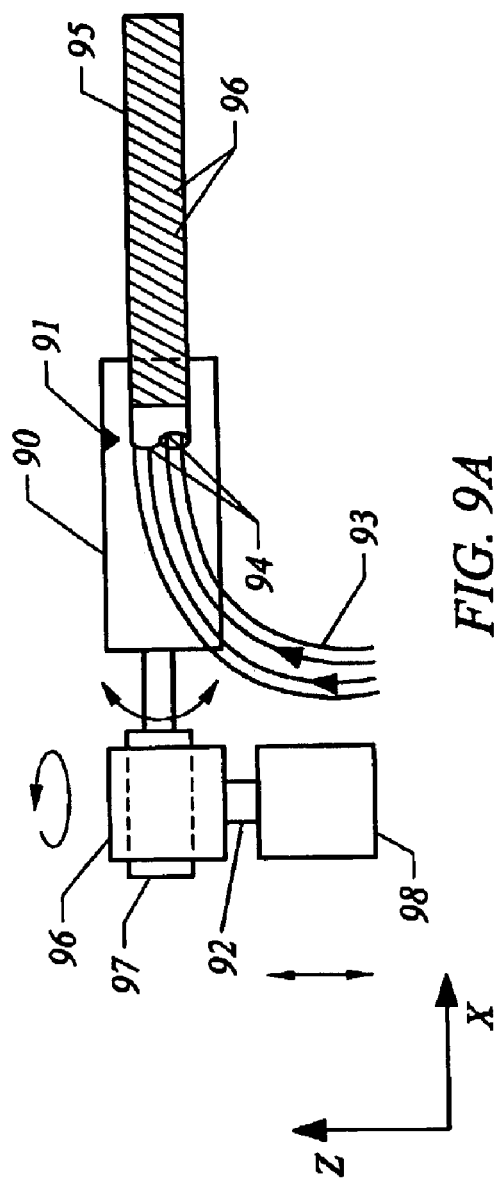
FIGS. 9A–9B illustrate side views of a rotatable radial dispense arm constructed with various driving mechanisms to provide arm movements having multiple degrees of freedom.
Figure 9B:
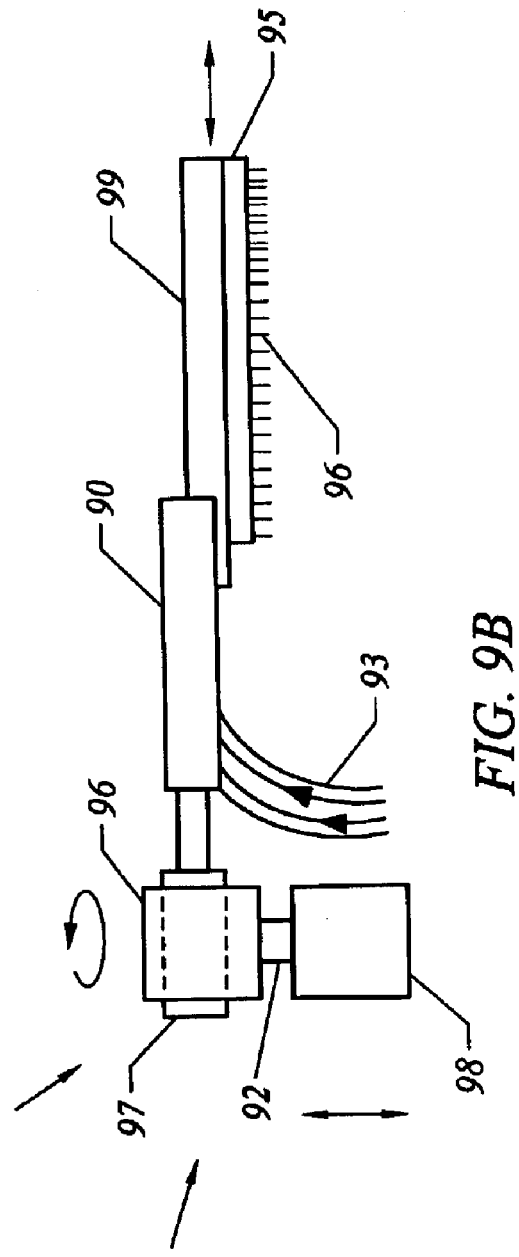

The rotatable radial dispense arms described herein may be constructed with various driving mechanisms to provide multiple degrees of freedom as shown in FIGS. 9A–9B. The movable support 90 can be selected from a variety of supporting apparatus such as a linear track arm, or a radial arm that is movable about a pivot point or post 92 within a wafer track system as shown. A fluid dispense nozzle 95 may be connected in fluid communication with a source containing material such as developer to be dispensed onto a wafer substrate. The radial arm 90 may suspend the fluid dispense nozzle 95 and be horizontally swept above selected portions over the wafer substrate with a first drive mechanism 96. A second drive mechanism 98 may be also selected to raise and lower the arm 90 along a defined Z-axis. The radial arm 90 can also include a third drive mechanism 97 or arm rotation device to rotate the arm 95 and attached nozzle about its longitudinal axis to alternate between a non-dispense (FIG. 9A) and a dispense state (FIG. 9B) to dispense fluids without or with reduced dripping. While a drive mechanism may rotate substantially the entire dispense arm, it shall be understood that such apparatus may be directly coupled to a nozzle portion itself for selected rotation thereof as with other embodiments of the invention herein. As shown in FIG. 9A, the fluid dispense nozzle 95 may include one or more fluid tubing 93 or other communication lines feeding into the nozzle from a source containing fluids such as developer, water and gases. The tubing 93 may lead into a series of inlets 94 formed along a side or end portion 91 of the nozzle body. These fluid inlets may be also formed along relatively top portions of available nozzles used today in the industry. As shown in FIG. 9B, the radial arm 90 (as with linear track arms described herein) may be also formed with an extendible or telescopic portion 99 to move the nozzle 95 along a defined X-axis to reach across various portions of a wafer substrate. The nozzle inserts or tips 96 may be formed as described herein at preselected angles relative to a bottoms surface of the nozzle 95. When the dispense arm 90 is rotated to a non-dispense position either before or after dispensing fluids, the nozzle tips % can point in a direction substantially away from a processed surface. These tips 96 may be rotated to point in a direction substantially parallel to the surface, or even pointed relatively upward beyond horizontal as described herein, to reduce the likelihood or occurrence of residual fluids inadvertently dripping onto a process coated wafer. It shall be understood that other embodiments of the invention such as nozzle body vacuum orifices and drip shields may be also combined with this illustrated dispense arm.

Figure 10A:
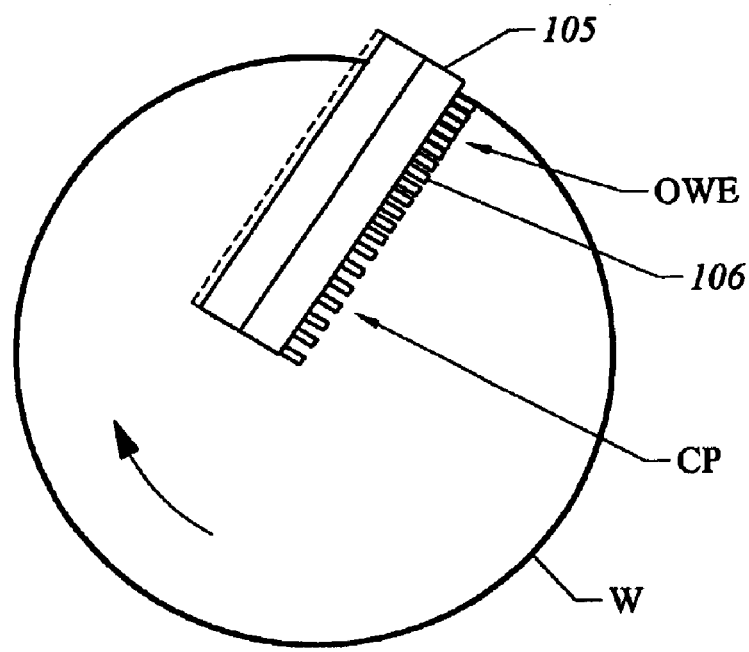
FIGS. 10A–10B are simplified top view illustrations of one or more fluid dispense nozzles provided in accordance with the invention which may be supported over a spinning wafer substrate.
Figure 10B:
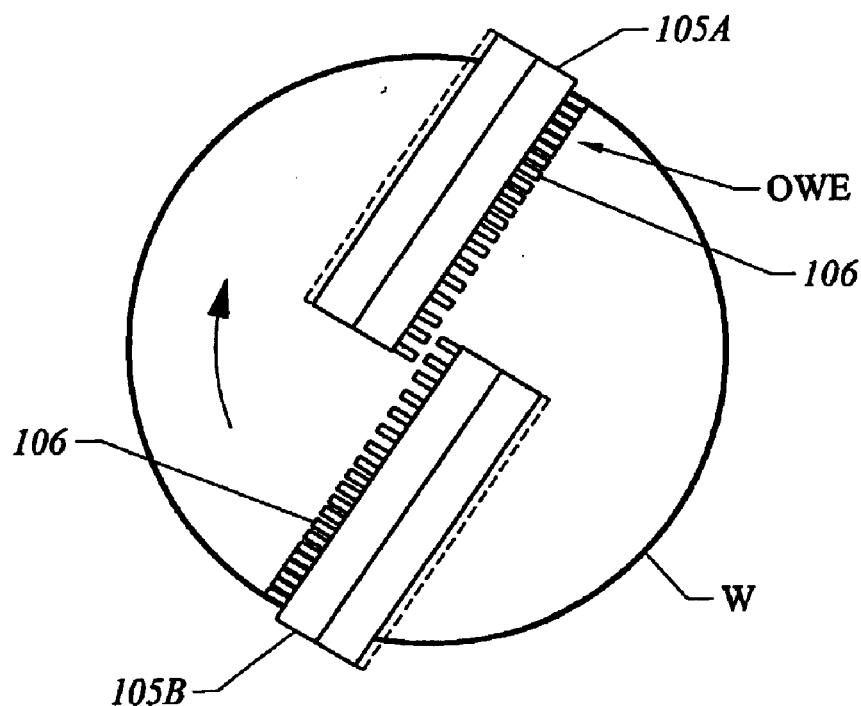

Another aspect of the invention provides various methods of substantially developing a photoresist-coated semiconductor wafer without developer or rinse solution drips. As shown in FIGS. 10A–10B, one or more fluid dispense nozzles 105 may be supported over the spinning wafer substrate W to dispense developer fluids and/or rinse solutions such as deionized water. The photoresist-coated wafer W may be delivered by known wafer handling apparatus from a resist coating module within a wafer track onto a spin chuck within a develop module. The developer arms described herein can include the single dispense nozzle configuration as shown in FIG. 10A, or the dual-nozzle configuration as seen in FIG. 10B. The developer arm and/or nozzle(s) may be to selectively rotated to a dispense position as shown over a selected region above the coated wafer. A predetermined amount of one or more developer solutions may be dispensed through the fluid tip openings 106 of the dispense nozzle 105 over the selected portion of the wafer W. After developer or other fluids are dispensed, the nozzle 105 may be rotated to a non-dispense or post-dispense position as described herein to reduce the occurrence of drips onto the resist coated wafer W. The nozzle(s) 105A and 105B may be also constructed with a suck-through screen or drip shield as earlier described to capture residual fluids originating from the external surface of the nozzle body or nozzle tips 106. As with other embodiments of the invention described elsewhere herein, the nozzle tips 106 may be also spaced evenly apart along the bottom surface of the nozzle body, or more preferably spaced closer together along portions that are suspended over relatively outer regions of the spinning wafer W. A higher density or collection of dispense tips over a relatively outer wafer edge (OWE) has been observed to spread out developer more evenly across the wafer surface, while a lower density of tips over a central portion (CP) of the wafer does not tend to supply or concentrate as much relatively "fresh" developer fluid to that portion of the wafer W. More nozzle tips 106 in proximity to the outer wafer region OWE can thus supply greater amounts of developer fluid to cover the relatively larger surface area when compared to lesser amounts needed to cover the relatively smaller surface area of the inner wafer region. Furthermore, when developer or other fluids are disposed onto a wafer W with nozzle embodiments formed with angled nozzle tips 106, it is preferable to dispense the fluid from the nozzle 105 generally along the same direction of the spinning wafer W as shown by the arrows provided. The tangential impact resulting from the released fluid onto the wafer W at an angle will be thus lessened in accordance with one aspect of the invention. Following dispense of developer solution(s), the dispense nozzle(s) 105A and 105B may be thereafter rotated into a non-dispense position in order to reduce the likelihood of dripping developer onto the wafer W as described herein.

As shown in FIGS. 10A–10B, the nozzle 105A and 105B may be positioned above the wafer substrate at preselected locations. The row of nozzle tips 106 may be substantially positioned along a selected radius thereof to form a film substantially covering the entire substrate surface following at least one complete rotation of the substrate. It may be preferable to permit 2–4 revolutions of the wafer to satisfactorily coat the wafer, which may be spun at various speeds including preferable speeds of about 60 revolutions per minute. Furthermore, the dispense arms herein may also position the fluid dispense nozzles 105A and 105B in a relatively offset position above an underlying substrate wherein the innermost nozzle tip 106 is not suspended over the center or axis of rotation of the wafer W. The nozzle 105 may be offset for example by approximately 3–5 mm. During rotation of the wafer W, the center portion of the wafer is therefore not supplied continuously with fresh developer which provides a more uniform distribution of fresh developer over the entire wafer surface resulting in better control of CD variations. Moreover, an offset nozzle position may allow both dispense nozzles 105A and 105B to be positioned simultaneously over the wafer W, if desired. Each nozzle 105A and 105B may be supported by separate independently operated dispense arms provided herein that are located on either side of a catch cup containing the wafer W to be developed or otherwise processed. As illustrated in FIG. 10B, a series of nozzles 105A and 105B may be positioned in a complementary manner or orientation over the wafer W either taking turns dispensing one or more types of fluids sequentially over the wafer, or at the same time. This configuration may ultimately reduce the number of arm movements since the return of a fluid dispense arm for depositing developer, for example, would not be required to return to a home or stand-by position while a fluid rinse dispense is positioned over the wafer to release deionized water. A combination of dispensed fluids could be readily overlapped onto the wafer or dispensed simultaneously from two separate nozzles; the wafer could be thus covered with solution quicker or about twice as fast using two dispense arms simultaneously to provide highly uniform pattern development. A set of cooperative dispense arms may thus include a "right-handed" dispense arm and "left-handed" dispense arm. When applied with other concepts of the invention herein, the nozzle supported by the right-handed arm may be connected to a variety of fluid sources which feed into one or two fluid dispense nozzle chambers therein, while the other nozzle supported by the left-handed arm may be connected to the same or other fluid sources which feed into two or three nozzle chambers formed therein. The right-handed dispense arm may be independently controlled and activated to perhaps dispense developer solution(s), while the left-handed dispense arm may be separately directed to dispense deionized water or other solutions. The risk of cross contamination between dispensed solutions is thus reduced further by dedicating multiple dispense arms for particular materials to be dispensed onto the wafer.

While the invention has been described with reference to the aforementioned specification, the descriptions and illustrations of the preferable embodiments herein are not meant to be construed in a limiting sense. It shall be understood that all aspects of the invention are not limited to the specific depictions, configurations or relative proportions set forth herein which depend upon a variety of conditions and variables. Various modifications in form and detail of the embodiments of the invention, as well as other variations of the invention, will be apparent to a person skilled in the art upon reference to the present disclosure. It is therefore contemplated that the appended claims shall also cover any such modifications, variations or equivalents.

What is claimed is:

1. An apparatus for developing a photoresist-coated substrate comprising:
    a spin chuck for supporting and rotating the photoresist-coated substrate;
    a developer source to supply at least one developer solution to be dispensed onto a substrate surface; and
    a rotatable arm mounted adjacent to the spin chuck for supporting a dispense nozzle that is in fluid communication with the developer source through at least one fluid channel, wherein the dispense nozzle is formed with a plurality of nozzle tips for dispensing developer solution onto the photoresist-coated substrate surface; and wherein the rotatable arm is configured to rotate about a longitudinal axis defined along its length to selectively position the dispense nozzle between: a dispense position that directs the nozzle tips in a direction substantially towards the substrate surface; and a non-dispense position that directs the nozzle tips substantially away from the substrate surface to reduce risk of dripping developer solution onto the substrate.

2. The apparatus as claimed in claim 1, wherein the rotatable arm includes a first motor-driven actuator for rotating the arm about its longitudinal axis, and a second motor-driven actuator for sweeping the rotatable arm across selected regions above the substrate.

3. The apparatus as claimed in claim 1, wherein the nozzle tips are directed away from the substrate surface at an angle ranging from approximately 0 to 90 degrees relative to the substrate surface while positioned in the non-dispense position.

4. The apparatus as claimed in claim 3, wherein the nozzle tips are directed away from and parallel to the substrate surface.

5. The apparatus as claimed in claim 1, wherein at least some of the nozzle tips are formed in a relatively linear pattern to provide a row of nozzle tips that has a predetermined length equal to approximately one-half of the diameter of the substrate.

6. The apparatus as claimed in claim 1, wherein the rotatable arm is configured as a radial arm mounted on a support post allowing pivotal movement about an axis for moving the dispense nozzle above the substrate along a predefined arc pathway.

7. The apparatus as claimed in claim 6, wherein the predefined arc pathway includes a position substantially above a central portion of the substrate.

8. The apparatus as claimed in claim 1, wherein the rotatable arm is a linear track arm for moving the dispense nozzle above the substrate along an X-axis direction.

9. The apparatus as claimed in claim 8, wherein the arm further includes an extendible portion for extending the dispense nozzle directly above preselected portions of the entire substrate along a Y-axis direction.

10. The apparatus as claimed in claim 1, wherein the rotatable arm is configured as a telescopic arm.

11. The apparatus as claimed in claim 1, wherein the rotatable arm further includes a vertical extendible member for moving the dispense nozzle in a relatively up-and-down direction along a Z-axis direction.

12. The apparatus as claimed in claim 1, further comprising:
    a rotatable rinse arm mounted adjacent to the spin chuck for supporting a rinse nozzle that is in fluid communication with a fluid rinse source through at least one rinse fluid channel, wherein the rinse nozzle is formed with a plurality of rinse nozzle tips for dispensing rinse fluid onto the substrate surface; and
    wherein the rinse arm is configured to rotate about a longitudinal axis defined along its length in order to selectively position the rinse nozzle between: a rinse position that directs the rinse nozzle tips in a direction substantially towards the substrate surface; and a non-rinse position that directs the rinse nozzle tips substantially away from the substrate surface to reduce risk of dripping rinse fluid onto the substrate.

13. An apparatus for supporting a fluid dispenser in a wafer track system with reduced dripping comprising:
    a fluid dispense nozzle formed with at least one nozzle opening that is connected to a fluid source containing material to be dispensed onto a wafer substrate; and
    a movable support for holding the fluid dispense nozzle above a selected portion of the wafer substrate, and wherein the support is further rotatable about its longitudinal axis to alternate between: a non-dispense state whereby the nozzle opening is rotated in a direction substantially pointed away from the wafer substrate; and a dispense state whereby the nozzle opening is rotated in a direction substantially pointed towards the wafer substrate for dispensing material onto the wafer substrate.

14. The apparatus as claimed in claim 13, wherein the movable support is a linear track arm formed with a telescopic portion.

15. The apparatus as claimed in claim 13, wherein the movable support is a radial arm movable about a pivot point.

16. The apparatus as claimed in claim 13, wherein the fluid source contains a developer solution.

17. The apparatus as claimed in claim 13, wherein the fluid source contains deionized water.

18. The apparatus as claimed in claim 13, wherein the fluid dispense nozzle includes a side portion, and wherein an inlet is formed along the side portion of the nozzle to provide fluid communication between the nozzle and the fluid source.

19. The apparatus as claimed in claim 13, wherein the fluid dispense nozzle includes a top portion, and wherein an inlet is formed along the top portion of the nozzle to provide fluid communication between the nozzle and the fluid source.

20. The apparatus as claimed in claim 13, further comprising a drip shield mounted to the fluid dispense nozzle for capturing residual drips when the fluid dispense nozzle is not positioned in a dispense state.

21. The apparatus as claimed in claim 20, wherein the nozzle opening is formed at the end of a nozzle tip, and wherein the drip shield includes an extended flange for capturing residual drips falling from the nozzle tip.

22. The apparatus as claimed in claim 20, wherein the fluid dispense nozzle is formed with at least one exhaust orifice connected to an exhaust source to remove material captured by the drip shield.

23. The apparatus as claimed in claim 13, further comprising a suck-through screen mounted to the fluid dispense nozzle for capturing residual drips.

24. The apparatus as claimed in claim 23, wherein the fluid dispense nozzle is formed with a series of exhaust orifices connected to a vacuum source to suck material from the area surrounding the screen through the suck-through screen.

25. A method of developing a photoresist-coated semiconductor wafer comprising the following steps of:
   spinning the photoresist-coated wafer on a spin chuck;
   selecting a developer arm that includes a dispense nozzle that is formed with fluid openings, wherein the developer arm is rotatable about a longitudinal axis of the developer arm to selectively rotate the dispense nozzle between a dispense position and a non-dispense position relative to the wafer;
   positioning the developer arm above a selected portion of the wafer wherein the dispense nozzle is rotated in a non-dispense position;
   rotating the developer arm about its longitudinal axis to position the dispense nozzle into a dispense-position over above the selected portion of the wafer;
   dispensing a predetermined amount of at least one developer through the fluid openings of the dispense nozzle over the selected portion of the wafer;
   rotating the developer arm about its longitudinal axis to position the dispense nozzle into a non-dispense position to reduce the likelihood of dripping developer onto the wafer; and
   positioning the developer arm at selected location away from the wafer and spin chuck.

26. A method of dispensing a fluid onto a semiconductor wafer with reduced dripping comprising the following steps of:
   selecting a fluid dispense arm that includes a dispense nozzle that is formed with fluid openings, wherein the arm is rotatable about its longitudinal axis to selectively rotate the dispense nozzle between a dispense position and a non-dispense position relative to the wafer;
   positioning the dispense arm above a selected portion of the wafer;
   rotating the dispense arm about its longitudinal axis to position the dispense nozzle into a dispense position;
   dispensing a predetermined amount of the fluid through the fluid openings of the dispense nozzle over the selected portion of the wafer;
   rotating the dispense arm about its longitudinal axis to position the dispense nozzle into a non-dispense position to reduce the risk of dripping fluid onto the wafer wherein the fluid openings of the dispense nozzle are directed substantially away from the wafer surface; and
   positioning the dispense arm at selected location away from the wafer.

27. The method as recited in claim 26, further comprising the step of: rotating the arm into a non-dispense position prior to positioning the arm above a selected portion of the wafer.

28. The method as recited in claim 26, further comprising the step of: selecting a horizontal arm extendible in the direction of a Y-axis to support the nozzle and a drive mechanism for linearly moving the arm in the direction of an X-axis in a horizontal plane.

29. The method as recited in claim 26, positioning the nozzle above the substrate so that the row of nozzle tips are substantially positioned along a selected radius of the substrate to form a film substantially covering the entire substrate surface.

30. The method as recited in claim 29, wherein the nozzle tips are positioned approximately 5 to 25 mm above the substrate.

* * * * *